US012782474B2

(12) United States Patent
Harris et al.

(10) Patent No.: US 12,782,474 B2
(45) Date of Patent: Nov. 3, 2026

(54) SYSTEM AND METHOD FOR DETECTING AND TRACKING MR INCOMPATIBLE DEVICES WITHIN A MR ENVIRONMENT

(71) Applicant: Synaptive Medical, Inc., Toronto (CA)

(72) Inventors: Chad Tyler Harris, Toronto (CA); Alex Gyles Panther, Toronto (CA); Cameron Anthony Piron, Toronto (CA); Gal Sela, Toronto (CA); Jeff Alan Stainsby, Toronto (CA)

(73) Assignee: SYNAPTIVE MEDICAL INC.

( * ) Notice: Subject to any disclaimer, the term of this patent is extended or adjusted under 35 U.S.C. 154(b) by 207 days.

(21) Appl. No.: 18/590,817

(22) Filed: Feb. 28, 2024

(65) Prior Publication Data

US 2025/0035722 A1 Jan. 30, 2025

Related U.S. Application Data

(60) Provisional application No. 63/487,277, filed on Feb. 28, 2023.

(51) Int. Cl.
*G01R 33/28* (2006.01)

(52) U.S. Cl.
CPC ......... *G01R 33/288* (2013.01); *G01R 33/283* (2013.01)

(58) Field of Classification Search
CPC ............................ G01R 33/288; G01R 33/283
See application file for complete search history.

(56) References Cited

U.S. PATENT DOCUMENTS

| | | | | |
|---|---|---|---|---|
| 9,947,090 | B2 | 4/2018 | Agam et al. | |
| 11,740,307 | B2 | 8/2023 | Sacolick et al. | |
| 2007/0057786 | A1* | 3/2007 | McClure | G01R 33/28 340/551 |
| 2014/0002080 | A1 | 1/2014 | Den Harder et al. | |
| 2014/0232400 | A1 | 8/2014 | Kim | |
| 2015/0008918 | A1 | 1/2015 | Nittka | |
| 2015/0362576 | A1 | 12/2015 | Jurrissen et al. | |
| 2016/0066877 | A1 | 3/2016 | Gluncic et al. | |
| 2017/0293005 | A1 | 10/2017 | Panther et al. | |
| 2018/0052210 | A1* | 2/2018 | Piron | G01R 33/288 |

(Continued)

FOREIGN PATENT DOCUMENTS

| | | | |
|---|---|---|---|
| JP | 2020044032 | A * | 3/2020 |
| WO | WO 2017064539 | A1 | 4/2017 |
| WO | WO 2017125790 | A1 | 7/2017 |

OTHER PUBLICATIONS

Machine Translation of JP-2020044032-A (Year: 2020).*

(Continued)

*Primary Examiner* — G.M. A Hyder

(57) ABSTRACT

A system and method for detecting an MR incompatible object in an MR environment is provided. One or more sensors of a detection system continuously scan for MR-incompatible objects. When an object is detected in the vicinity of the MRI, a warning system in communication with the detection system provides a warning. The detection system may also determine whether the object is in a defined warning zone, safety zone, or critical safety zone. A warning is issued if the object is in the warning zone. The main magnetic field of the MRI is removed if the object is in the safety or critical safety zone. Further safety measures may also be deployed.

16 Claims, 3 Drawing Sheets

(56) References Cited

U.S. PATENT DOCUMENTS

2023/0349994 A1 11/2023 Sacolick et al.

OTHER PUBLICATIONS

Examiner's Report issued by the Intellectual Property Office of the UK in relation to GB Application No. GB2009676.4 dated Dec. 6, 2020.

Examiner's Report issued by the Intellectual Property Office of the UK in relation to GB Application No. GB2009676.4 dated May 9, 2023.

* cited by examiner

SYSTEM AND METHOD FOR DETECTING AND TRACKING MR INCOMPATIBLE DEVICES WITHIN A MR ENVIRONMENT

CROSS-REFERENCE TO RELATED APPLICATIONS

This application claims priority from U.S. provisional patent application No. 63/487,277, filed Feb. 28, 2023, the contents of which is incorporated herein by reference.

BACKGROUND

The field of the invention is systems and methods for magnetic resonance imaging ("MRI"), in particular safety systems for MRI.

Magnetic resonance imaging (MRI) systems generally include a main magnet generating a magnetic field tens of thousands of times stronger than the earth's magnetic field. As a result, in certain situations, the main magnet can attract MR-incompatible objects. For example, foreign metal objects, when brought within the vicinity of the magnetic field, can become projectiles, flying into the main magnet and causing disastrous damage. In this example, MR-incompatible objects, such as an object including ferromagnetic material, can be attracted by the fringe field of the main magnet.

The MR-incompatible objects may include carts, oxygen tanks, and tools (e.g., metal wrenches). Once attracted, these objects may be accelerated by the magnetic force imparted by the main magnetic field and can become high-velocity projectiles capable of damaging the magnet or harming a human patient or MR operator. This is a significant operational hazard of the MRI system, especially when a patient is being scanned inside the magnet.

In an intraoperative setting, MR unsafe material can be placed on/near the patient and go unnoticed during patient transfer to the intraoperative MRI (iMRI) system. For example, such tools as metal scalpels, wrenches, and other tools can provide a hazardous situation that may cause serious injury.

Another situation that poses a safety risk occurs when a person who is untrained or unqualified is in the vicinity of the MRI system. Thus, an untrained or unqualified person may also represent an MR-incompatible object.

One method for shutting down an MRI involves a "quench button" which will initiate a quenching process. Quenching is the process whereby there is a sudden increase of temperature in the magnet coils, so that they cease to be superconducting and become resistive, thus eliminating the magnetic field. This results in helium escaping from the cryogen bath extremely rapidly and the potential of damage to the main magnet.

There is a desire for a system and method for detecting MR-incompatible objects in a MRI environment and taking action to eliminate the magnetic field without going through a quenching process.

SUMMARY

Figure 1:
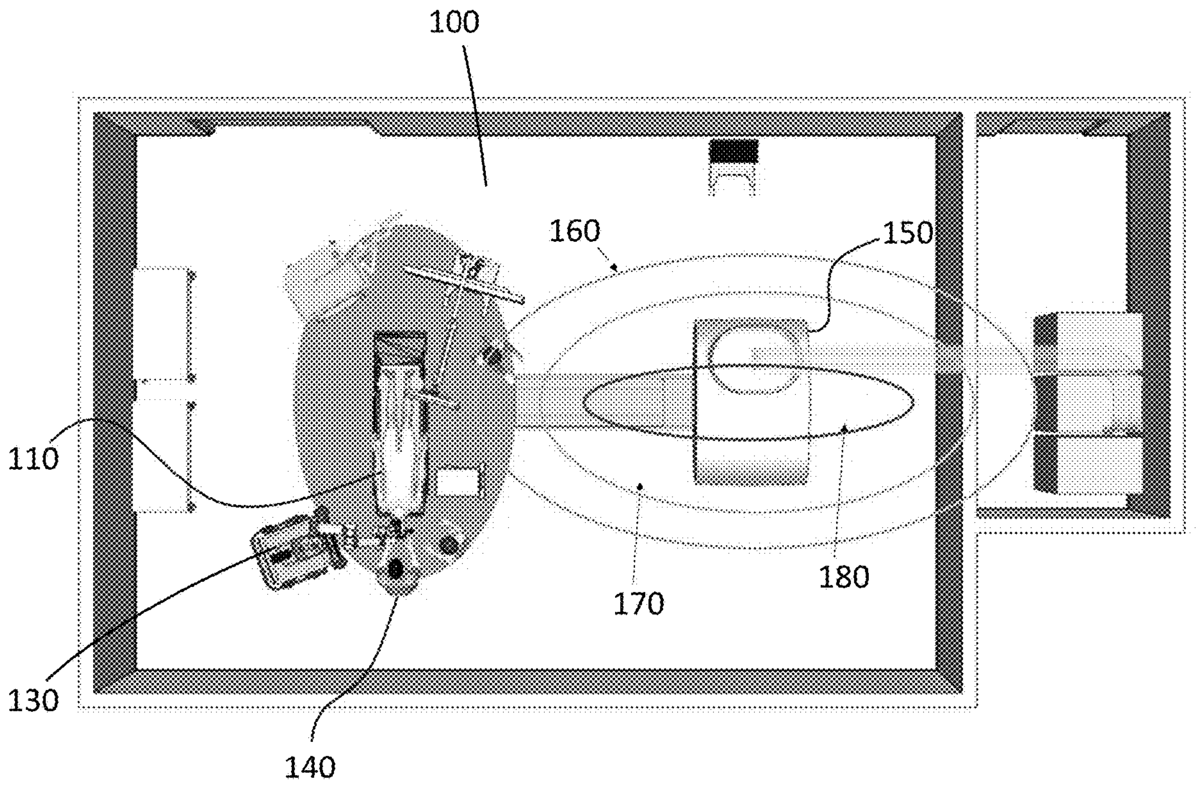
FIG. 1 is a diagram illustrating a top-plan view of an interoperative MRI operating room with a detection system for MR-incompatible objects.

A system and method are provided for detecting an MR-incompatible object within a vicinity of an MRI. The system includes a detection system for the MR-incompatible object that continuously scans for a location of the incompatible object, and a warning mechanism in communication with the detection system for providing a warning when an MR-incompatible object is in the vicinity of the MRI. The method includes continuously scanning for a location of the incompatible object using a detection system and providing a warning if the location of the incompatible object is in the vicinity of the MRI, using a warning mechanism. In an embodiment, the detection system determines whether the object is in a warning zone, a safety zone, or a critical safety zone. A warning is issued if the object is in the warning zone. The main magnetic field of the MRI is turned off if the object is in the safety or critical safety zone. Further safety measures may also be deployed, particularly if the object is detected to be in the critical safety zone.

DETAILED DESCRIPTION

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

According to the disclosure, mechanisms to increase the safety of an MRI system are disclosed. These mechanisms include warning systems, multiple zones, and the use of detectable sensors.

The present invention is a detection system and method for MR-incompatible objects. If the incompatible object is detected within a vicinity of the MRI then a warning is sent to the MRI users and/or the MRI system reacts in an appropriate manner.

The detection system can be in one or more of many forms. Examples of the detection system include a radiofrequency (RF) based approach, an optical approach, a magnetic approach, or an inductive approach.

The detection system may operate in radio frequency (RF) ranges. For example, the detection system may use RFID tags, either active or passive tags. By using a unique device identifier (UDI) tag, information on the equipment identified can be looked up and used to determine if it is MR safe or unsafe. Proprietary issued RFID tags that are only placed on MR unsafe equipment may also be implemented.

Some implementations may place a sensor device such as an RFID tag on MRI-incompatible objects in the scan room. For example, such a sensor device may be placed on an anesthesia cart and configured to detect and transmit location data indicating a location of the cart. In some instances, the location data may include proximity data indicating the distance between the sensor device on the object and sensor device mounted on magnet housing. Such location data may be communicated to the detection system. The communication between sensor devices and the detection system may be through a wireless technology such as Bluetooth, infrared, WiFi, cellular, etc. In other instances, the location data may also indicate a motion or acceleration of the cart in the scan room. When acceleration motion is detected, one or more air bags may be inflated to buffer the potential impact of the accelerating object hitting magnet housing or patient inside the bore of the MRI system. The EM operating frequency may be chosen to avoid aliasing with respect to the Larmor frequency, at which the MRI system operates to generate an MR image of the patient. Such location data broadcast from sensor devices may be still another source of input data for further processing by the detection system.

In another example, a sensor device of the detection system may include a transmitting RF antenna to rotate a RF beam around the scan room, searching for potentially MR-incompatible objects. In this example, a receiving RF antenna may be placed on the floor around the perimeter of safety zone, or around the shoe molding level of the surrounding walls to detect blockage of any RF beams. The transmitting RF antenna of the sensor device mounted on top of magnet housing may operate in duplex mode to receive RF beams reflected from objects in the scan room. Such monitoring approaches can be extended to monitoring using ultrasound beams. The monitored range information can be another source of input data for further processing by the detection system.

In an example of the optical approach, a camera device detects sensors placed on components which should not be within the vicinity of the MRI system (e.g., anesthesia cart). Note that the camera does not need to be operating in the visual spectrum of light (e.g., it could be in infrared). The camera device may operate in visible light or infrared ranges. The camera device may be mounted on the magnetic housing of the MRI system. In another embodiment, the camera device may be located outside the room, for example, in the console room, to monitor the scan room through a glass shield. As an illustration, the camera device can capture video frames and then process the captured video frames to identify potentially MR-incompatible objects and track the motions of the identified objects. Examples of such objects include anesthesia carts, oxygen tanks, or working tools such as wrenches. The readout from the camera device, for example, a live video feed, may serve as one source of input data for further processing by the detection system.

In another example of the optical approach, the detection system may include a system that leverages the readout from optical or electromagnetic (EM) tracking markers placed on potentially MR-incompatible objects. Examples of optical tracking markers include fluorescent objects, or light-emitting-diodes. For illustration, the system may monitor the positional information of such objects in the scan room by sensing the whereabouts of optical or EM tracking markers and projecting the positional information on a live video stream of the scan room. The sensed positional information can be another source of input data for further processing by the detection system.

Some configurations of the detection system may leverage a magnetic readout. For example, sensor devices may be magnetic field probes placed on objects which can pose an operational hazard within safety zone 201 (e.g., an anesthesia cart). If the magnetic field probe detects that it is within a magnetic field above a certain threshold, the field probe may send a signal, for example, via radio wave or infrared light. Example magnetic field probes include Gauss meters or Hall probes. The readout signal may be communicated to a control unit, which may then analyze and compare the readout value to a numerical threshold. If the readout value is over a threshold safety value, the detection system sends a signal to trigger a shutdown of the MRI magnetic field. A warning signal may be activated or other action taken. The magnetic readout may also serve as an additional source of input data for further processing by the detection system.

Some implementations of the detection system may exploit the inductive effect caused by a magnetic object that moves quickly through the magnetic field of the MRI magnet, the superconducting wires, or a specially designed coupling circuit. Specifically, such motions can induce fluctuations in the current due to inductive coupling between the object and the MRI system or circuit. The magnitude of the fluctuation would correlate with the safety profile of the device. A sensor device may measure the level of current fluctuation, which can then be compared to a threshold. Fluctuation thresholds would decide on the system safety procedure (for example, a warning signal, to ramp down the main magnet of the MRI, patient protection by a physical barrier, etc.). If the fluctuation is above a safety threshold level, the detection system can trigger a shutdown sequence to turn down the power supply of the magnet. The readout from this inductive approach may be an additional source of input data for further processing by the detection system.

The readouts from one or more of these various mechanisms for the detection system may be consolidated at a control unit of the detection system to render a determination as to the nature of the object as well as the level of threat. In instances where more than one type of mechanism is used, the various readings may be used to corroborate each other to enhance the confidence that a detected object poses a threat. For example, a readout from a camera device may detect the presence of an object in the scan room, while a readout from a magnetic field probe placed on the object may confirm that the detected object is seeing a magnetic field above a threshold level. Once a final determination is made based on the combined readout that the detected object poses an operational hazard, precautionary steps may be taken by the control unit to provide a warning, to reduce the magnetic field of the magnet, or to take safety measures such as releasing an airbag to protect the patient being scanned in the bore area.

When the detection system detects an MR-incompatible object, the location of the object is determined by the detection system. In an embodiment, there may be two detection zones: a warning zone and a safety zone.

When the device is detected in the warning zone, a warning alarm is issued. In one example, the alarm may be an audible signal from the MR scanner. In another example, the alarm may be an audible signal from the MR-incompatible device itself. In yet another example, the alarm may be a vibration of the MR-incompatible device. In another example, the alarm may be a visual cue from the MRI system.

When the device is detected in the safety zone, the MRI system is triggered to decrease the main magnetic field. As outlined below, the response of decreasing the main magnetic field is advantageous over a quenching process of the MRI.

There are drawbacks to conducting a quenching process of an MRI. First, it requires user intervention and it is not automatic or automatically initiated by the MRI system. Second, the quench may render the MRI system incapable of powering back on. Third, the quenching process can be expensive as it requires replacement of the entire Helium bath if one was present.

In an MRI system, the wires that carry current are typically in a superconducting state to power, for example, the solenoid magnet of the MRI system. In this superconducting state, the wires can carry large amounts of current for generating a strong magnetic field of, for example, 1 Telsa or above. Maintaining this superconducting state generally means that the wires are kept at a cryogenic temperature (e.g., below a certain critical temperature). As an illustration, temperature of the solenoid magnet is normally at 4 Kelvin. Typically a helium compressor is used for maintaining the low temperature for the wires. If the helium compressor loses its alternate current (AC) main power (or the helium compressor is disconnected, or a cable damaged, etc.), the solenoid magnet will gradually warm up until the critical temperature of the superconducting wire is reached, at which point the wire would become resistive, and the resistive losses in the wire would cause a sudden increase of magnet temperature (also known as a quench) due to resistive heating and subsequently a precipitous drop in the amount of current carried by the wires. In this event, the magnet temperature rapidly rises to a much higher temperature such as 50 Kelvin. The MRI system will be inoperable until the magnet temperature is lowered back to, for example, 4K, which could take several hours or even longer. To avoid this undesirable delay, the magnet temperature can be monitored. If a loss of cooling is detected, the MRI system can initiate a ramp down of the magnet. If the magnet has been ramped down (e.g., no current in the magnet wires) when the temperature crosses the superconducting critical temperature threshold, then there would be no quench, and no rapid increase in temperature. By adding this feature, the time for the magnet to be ramped back up for operation can be reduced.

In some implementations of the present disclosure, turning down the magnet may not cause a controlled quench of the magnet. Instead, in these implementations, the magnetic field of the magnet can be ramped up after the detected hazard is gone. For example, once the hazard is detected, the control unit of MRI system may initiate automatic field reduction while signaling human intervention. When it is determined that the MR-incompatible object is removed from the vicinity of the MRI, a control unit of MRI system may initiate automatic ramping up to bring the magnet back to normal operation ready for scanning patients.

In another embodiment of the disclosure, there may be a third zone, a safety critical zone wherein there is a patient in the MRI scanner. If the MR-incompatible object is detected within the safety critical zone there can be a response that tries to protect the patient. In non-limiting examples, the response may be to implement a physical barrier to protect the patient, for example a protective airbag as protection from any projectiles while the magnetic field is shut down.

As an example of the warning zone, the safety zone and the safety critical zone, the warning zone may be the 3-10 Gauss region of the MRI system; the safety zone may be the 20-30 Gauss region of the system; and the safety critical zone may be the over 50 Gauss region of the MRI system in-line with the MRI system bore. As another example, the safety critical zone may be the region where the field multiplied by the field gradient is strongest, typically at the entrance and exit of the bore of the system.

In a further embodiment, detectable sensors may be incorporated into medical gowns, medical scrubs and security badges in order to track people in the operating room/operating theatre/MRI zones. Furthermore, these detectable sensors may be used to keep non-trained people away from the MRI magnet. If someone that is not trained gets too close to the MRI system, an alarm or notification can be triggered. Furthermore, detection of the non-trained person or unapproved person can prohibit the system to ramp (turn its main magnetic field on) or operate.

Referring to FIG. 1, a diagram illustrates a top plan view of an interoperative MRI (iMRI) operating room 100 with an MRI detection system (not shown). According to FIG. 1, a patient 110 is shown on a surgical table of an operating room 100. A surgical microscope and surgical navigation system 130 is shown nearby to assist the surgeon 140 and his/her team with the surgical procedure. Nearby is an MRI system 150 with the detection system indicating three safety zones (i.e., a warning zone 160, a safety zone 170, and a safety critical zone 180).

Figure 2:
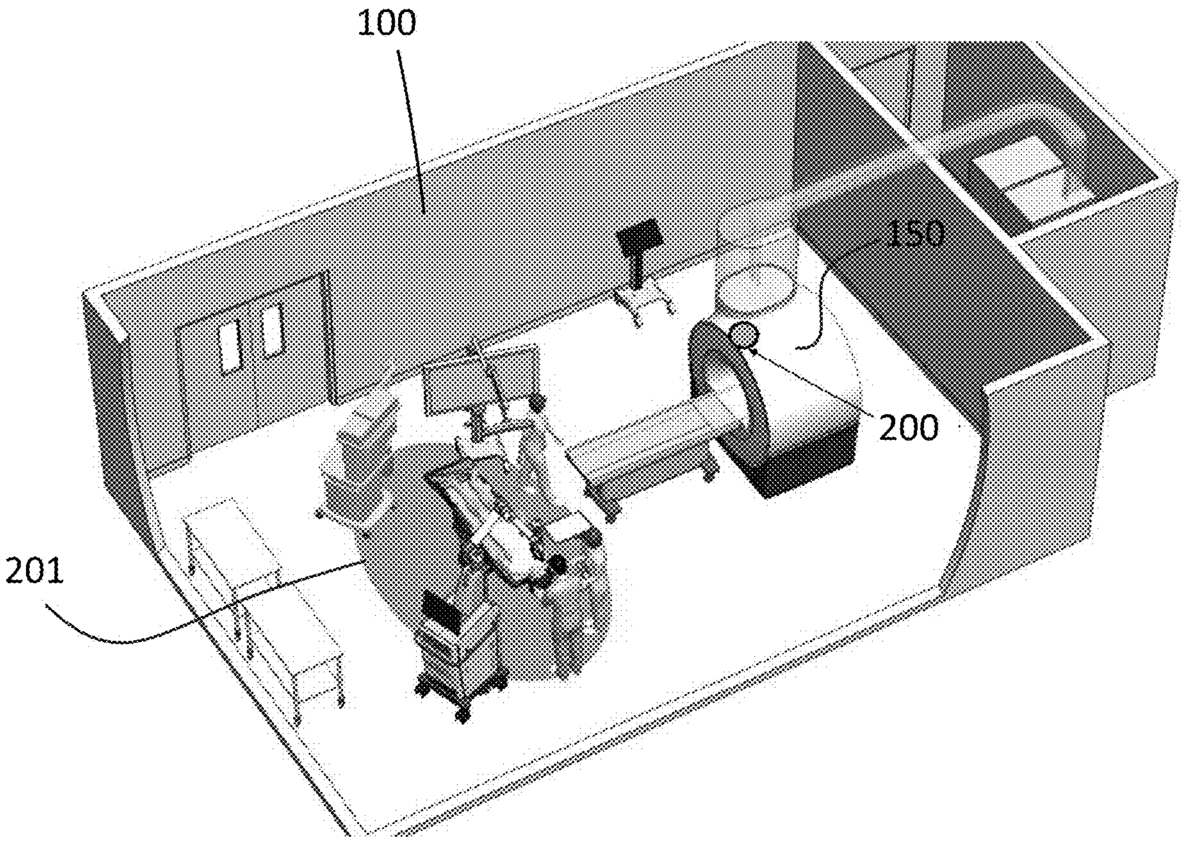
FIG. 2 is a diagram illustrating a perspective view of the interoperative MRI operating room illustrated in FIG. 1.

Referring to FIG. 2, a diagram illustrates a perspective view of an MRI operating room 100 with an MRI detection system. According to FIG. 2, the operating room 100 in FIG. 1 is shown in perspective view. A sensor 200 is shown to be placed on top of the MRI system 150 as part of the MRI detection system. As previously described, this detection system can be provided in many forms. Furthermore, there may be multiple sensors 200 distributed throughout the room.

Figure 3:
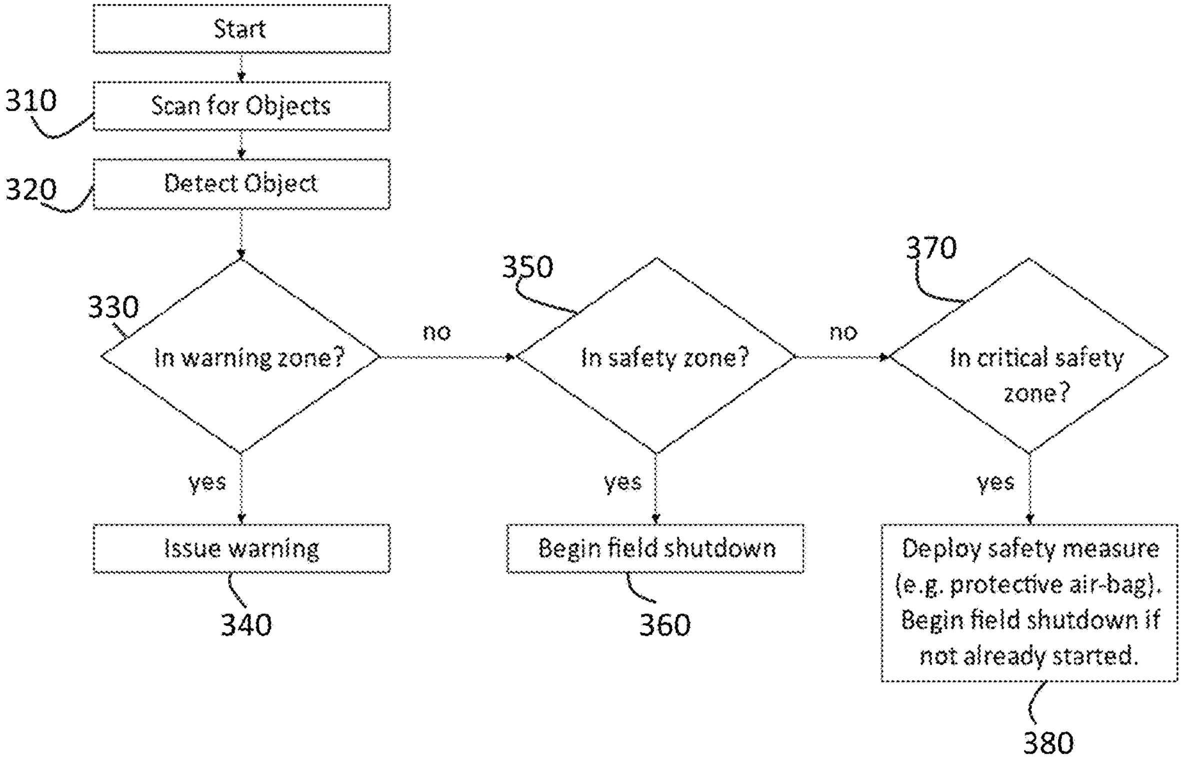
FIG. 3 is a diagram illustrating an example of a workflow process of a detection system for MR-incompatible objects.

Referring to FIG. 3, a workflow process of the detection system is shown. According to FIG. 3, the workflow initiates by continually scanning for objects by the detection system 310. The next step is to detect an object 320. The detection system determines whether the object is in the warning zone 330. If so (i.e., yes), a warning is issued 340. If not, the MRI detection system then determines whether the object is in the safety zone 350. If so (i.e., yes), then a magnetic field shutdown procedure is initiated to shut down or turn off the main magnetic field of the MRI 360.

According to the disclosure, if the object is determined to not be in the safety zone, the process then moves onto the next step to determine whether the object is in the critical safety zone 370. If the response is Yes, then the system deploys necessary safety measures 380. Non-limiting examples of safety measures include to deploy a protective airbag or introduce a physical barrier. The system also begins the magnetic field shutdown of the MRI. If the object is determined to be in none of the zones, then the detection system does nothing.

GENERAL CONSIDERATIONS

While some embodiments or aspects of the present disclosure may be implemented in fully functioning computers and computer systems, other embodiments or aspects may be capable of being distributed as a computing product in a variety of forms and may be capable of being applied regardless of the machine or computer-readable media used to affect the distribution.

At least some aspects disclosed may be embodied, at least in part, in software. That is, some disclosed techniques and methods may be carried out in a computer system or other data processing system in response to its processor, such as a microprocessor, executing sequences of instructions contained in a memory, such as read-only memory (ROM), volatile random-access memory (RAM), non-volatile memory, cache or a remote storage device.

The functions described herein may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer. It should be noted that a computer-readable medium may be tangible and non-transitory. As used herein, the term "code" may refer to software, instructions, code or data that is/are executable by a computing device or processor. A "module" can be considered as a processor executing computer-readable code.

A processor as described herein can be a general-purpose processor, a digital signal processor (DSP), an application specific integrated circuit (ASIC), a field programmable gate array (FPGA) or other programmable logic device, discrete gate or transistor logic, discrete hardware components, or any combination thereof configured to perform the functions described herein. A general-purpose processor can be a microprocessor, but in the alternative, the processor can be a controller, or microcontroller, combinations of the same, or the like. A processor can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor may also include primarily analog components. For example, any of the signal processing algorithms described herein may be implemented in analog circuitry. In some embodiments, a processor can be a graphics processing unit (GPU). The parallel processing capabilities of GPUs can reduce the amount of time for training and using neural networks (and other machine learning models) compared to central processing units (CPUs). In some embodiments, a processor can be an ASIC including dedicated machine learning circuitry custom-build for one or both of model training and model inference. The disclosed or illustrated tasks can be distributed across multiple processors or computing devices of a computer system, including computing devices that are geographically distributed.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

The specific embodiments described above have been shown by way of example and understood is that these embodiments may be susceptible to various modifications and alternative forms. Further understood is that the claims are not intended to be limited to the forms disclosed, but rather to cover all modifications, equivalents, and alternatives falling within the spirit and scope of this disclosure. While the foregoing written description of the system enables one of ordinary skill to make and use what is considered presently to be the best mode thereof, those of ordinary skill will understand and appreciate the existence of variations, combinations, and equivalents of the specific embodiment, method, and examples herein. The system should therefore not be limited by the above-described embodiment, method, and examples, but by all embodiments and methods within the scope and spirit of the system. Thus, the present disclosure is not intended to be limited to the implementations shown herein but is to be accorded the widest scope consistent with the principles and novel features disclosed herein.

Information as herein shown and described in detail is fully capable of attaining the above-described object of the present disclosure, the presently preferred embodiment of the present disclosure, and is, thus, representative of the subject matter which is broadly contemplated by the present disclosure. The scope of the present disclosure fully encompasses other embodiments which may become obvious to those skilled in the art, and is to be limited, accordingly, by nothing other than the appended claims, wherein any reference to an element being made in the singular is not intended to mean "one and only one" unless explicitly so stated, but rather "one or more." All structural and functional equivalents to the elements of the above-described preferred embodiment and additional embodiments as regarded by those of ordinary skill in the art are hereby expressly incorporated by reference and are intended to be encompassed by the present claims.

Moreover, no requirement exists for a system or method to address each problem sought to be resolved by the present disclosure, for such to be encompassed by the present claims. Furthermore, no element, component, or method step in the present disclosure is intended to be dedicated to the public regardless of whether the element, component, or method step is explicitly recited in the claims. However, various changes and modifications in form, material, workpiece, and fabrication material detail may be made, without departing from the spirit and scope of the present disclosure, as set forth in the appended claims, as may be apparent to those of ordinary skill in the art, are also encompassed by the present disclosure.

What is claimed is:

1. A system for detecting an MR-incompatible object in a vicinity of an MRI, the system comprising:

a detection system for continuously scanning for a location of the incompatible object; and a warning mechanism in communication with the detection system, for providing a warning when the location of the incompatible object is in a vicinity of the MRI;

wherein the vicinity of the MRI comprises a critical safety zone and when the location of the incompatible object is the critical safety zone, a safety measure is deployed and the MRI system removes a main magnetic field; and wherein the safety measure comprises at least one of an airbag for a patient in the MRI or a physical barrier.

2. The system of claim 1, wherein the detection system comprises at least one of:

a radiofrequency receiver for detecting a signal from an RFID tag on the incompatible object;

an optical camera for detecting the incompatible object;

a magnetic field probe on the incompatible object for detecting when the incompatible object is within a magnetic field; and a current fluctuation sensor, for detecting a current fluctuation in a superconducting wire of the MRI or in a coupling circuit in the MRI, wherein the current fluctuation is due to an inductive coupling between the incompatible object and the superconducting wire of the MRI or between the incompatible object and the coupling circuit in the MRI.

3. The system of claim 1, wherein the vicinity of the MRI further comprises a warning zone;

and when the location of the incompatible object is the warning zone, the warning is issued.

4. The system of claim 3, wherein the warning zone comprises a 3-10 Gauss region of the MRI and the safety zone comprises a 20-30 Gauss region of the MRI.

5. The system of claim 1, wherein the warning is at least one of:

an audible signal from the MRI;

an audible signal from the incompatible object;

a vibration of the incompatible object; and a visual cue from the MRI.

6. The system of claim 1, wherein the detection system is incorporated into at least one of a medical gown, a medical uniform and a security badge and the incompatible object comprises a person.

7. The system of claim 6, further wherein the person comprises a non-trained person or an unapproved person, and the warning mechanism comprises at least one of: an alarm; a notification; a prohibition of the MRI to have a main magnetic field; and a prohibition of the MRI to operate.

8. The system of claim 1, wherein the critical safety zone comprises at least one of: a region where a corresponding magnetic field multiplied by a corresponding field gradient is above a threshold value; and a region greater than 50 Gauss.

9. A method for detecting an MR-incompatible object in a vicinity of an MRI, the method comprising:

continuously scanning for a location of the incompatible object using a detection system; and providing a warning if the location of the incompatible object is in a vicinity of the MRI using a warning mechanism;

wherein the vicinity of the MRI comprises a critical safety zone and when the location of the incompatible object is the critical safety zone, a safety measure is deployed and the MRI shuts down; and wherein the safety measure comprises at least one of providing an airbag for a patient in the MRI or providing a physical barrier.

10. The method of claim 9, wherein the detection system comprises at least one of:

a radiofrequency receiver detecting a signal from an RFID tag on the incompatible object;

an optical camera detecting the incompatible object;

a magnetic field probe on the incompatible object detecting when the incompatible object is within a magnetic field; and a current fluctuation sensor detecting a current fluctuation in a superconducting wire of the MRI or in a coupling circuit in the MRI, wherein the current fluctuation is due to an inductive coupling between the incompatible object and the superconducting wire of the MRI or between the incompatible object and the coupling circuit in the MRI.

11. The method of claim 9, wherein the vicinity of the MRI further comprises a warning zone and when the location of the incompatible object is the warning zone, the warning is issued.

12. The method of claim 11, wherein the warning zone comprises a 3-10 Gauss region of the MRI and the safety zone comprises a 20-30 Gauss region of the MRI.

13. The method of claim 9, wherein the warning is at least one of:

an audible signal from the MRI;

an audible signal from the incompatible object;

a vibration of the incompatible object; and a visual cue from the MRI.

14. The method of claim 9, wherein the detection system is incorporated into at least one of a medical gown, a medical uniform and a security badge and the incompatible object comprises a person.

15. The method of claim 14, further wherein the person comprises a non-trained person or an unapproved person, and the warning mechanism comprises at least one of: an alarm; a notification; a prohibition of the MRI to have a main magnetic field; and a prohibition of the MRI to operate.

16. The method of claim 9, wherein the critical safety zone comprises at least one of: a region where a corresponding magnetic field multiplied by a corresponding field gradient is above a threshold value; and a region greater than 50 Gauss.

* * * * *